United States Patent
Koide

(10) Patent No.: US 8,368,230 B2
(45) Date of Patent: Feb. 5, 2013

(54) ELECTRONIC PART AND METHOD OF MANUFACTURING THE SAME

(75) Inventor: Masateru Koide, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/857,893

(22) Filed: Aug. 17, 2010

(65) Prior Publication Data

US 2011/0042824 A1 Feb. 24, 2011

(30) Foreign Application Priority Data

Aug. 20, 2009 (JP) ................................. 2009-191280

(51) Int. Cl.
*H01L 25/03* (2006.01)

(52) U.S. Cl. ................. 257/777; 257/E25.013; 438/107

(58) Field of Classification Search ................ 257/686, 257/777, 774, E25.013; 438/107, 462
See application file for complete search history.

(56) References Cited

U.S. PATENT DOCUMENTS

| | | | |
|---|---|---|---|
| 5,796,165 A | 8/1998 | Yoshikawa et al. | |
| 7,084,487 B1 * | 8/2006 | Conn | 257/660 |
| 7,405,105 B2 * | 7/2008 | Han et al. | 438/108 |
| 7,868,439 B2 * | 1/2011 | Chang et al. | 257/686 |
| 7,911,044 B2 * | 3/2011 | Yang et al. | 257/685 |
| 7,985,663 B2 * | 7/2011 | Sato et al. | 438/464 |
| 2002/0074637 A1 * | 6/2002 | McFarland | 257/686 |
| 2002/0074668 A1 * | 6/2002 | Hofstee et al. | 257/777 |
| 2004/0178488 A1 * | 9/2004 | Bolken et al. | 257/686 |
| 2006/0038272 A1 * | 2/2006 | Edwards | 257/686 |
| 2007/0018333 A1 * | 1/2007 | Tsai et al. | 257/777 |
| 2007/0090534 A1 * | 4/2007 | Iwasaki et al. | 257/777 |
| 2007/0164418 A1 * | 7/2007 | Brunnbauer | 257/685 |
| 2007/0194455 A1 * | 8/2007 | Ikeda et al. | 257/777 |

FOREIGN PATENT DOCUMENTS

| | | |
|---|---|---|
| JP | 06-283661 | 10/1994 |
| JP | 08-321567 | 12/1996 |
| JP | 09-293824 | 11/1997 |
| JP | 11-067963 | 3/1999 |
| JP | 11-163249 | 6/1999 |
| JP | 2001-094033 | 4/2001 |

* cited by examiner

*Primary Examiner* — Nathan Ha
(74) *Attorney, Agent, or Firm* — Squire Sanders (US) LLP

(57) ABSTRACT

A multi-chip module includes a package board, a plurality of chips, and a wiring board. The plurality of chips are horizontally disposed on the package board. The plurality of chips are electrically connected with the package board, and respectively provided with via holes which penetrate through the plurality of chips. The plurality of chips are respectively provided with circuits at surfaces facing the package board. The wiring board is disposed on an opposite side to the package board across the plurality of chips. The wiring board includes a wiring pattern which is electrically connecting adjacent chips one another. The circuit is electrically connected to the wiring pattern through the via holes.

5 Claims, 6 Drawing Sheets

ELECTRONIC PART AND METHOD OF MANUFACTURING THE SAME

CROSS-REFERENCE TO RELATED APPLICATIONS

This application is based upon and claims the benefit of priority of the prior Japanese Patent Application No. 2009-191280, filed on Aug. 20, 2009, the entire contents of which are incorporated herein by reference.

FIELD

Embodiments discussed herein are related to a multi-chip module and a method of manufacturing the same.

BACKGROUND

There is known a semiconductor chip module called multi-chip module (MCM). In a conventional multi-chip module, multiple silicon chips which have been manufactured by separate processes are horizontally packaged onto a unifying substrate. Bare silicon chips are exposed, and are respectively connected with each other through a wiring formed on a ceramic or a build-up board (See for example Japanese Unexamined Patent Publication No. 6-283661).

However, in order to secure a substantial channel area in response to the wiring specification of the ceramic or the build-up board in JP-A-6-283661, a clearance between adjacent chips has to be large.

Additionally, since the large clearance between the chips elongates a wiring length between the chips, it may be difficult to transmit data at high rates between the chips such as large-scale integration (LSI) chips. Further, when the wiring length is elongated, the driver installed in the LSI has to be changed into another lager driver, and the size of the LSI may be accordingly larger. Furthermore, the provision of a large number of channels in the board is limited by the wiring specification.

On the other hand, recently, there has been developed a board having fine wirings such as a build-up board (See for example Japanese Unexamined Patent Publication No. 2001-94033). However, to manufacture the build-up board, a specific process or an equipment is additionally needed. Thus, its cost may be increased.

SUMMARY

According to an aspect of the embodiments, a multi-chip module includes a package board, a plurality of chips, and a wiring board. The plurality of chips are horizontally disposed on the package board. The plurality of chips are electrically connected with the package board, and respectively provided with via holes which penetrate through the plurality of chips. The plurality of chips are respectively provided with circuits at surfaces facing the package board. The wiring board is disposed on an opposite side to the package board across the plurality of chips. The wiring board includes a wiring pattern which is electrically connecting adjacent chips one another. The circuit is electrically connected to the wiring pattern through the via holes.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
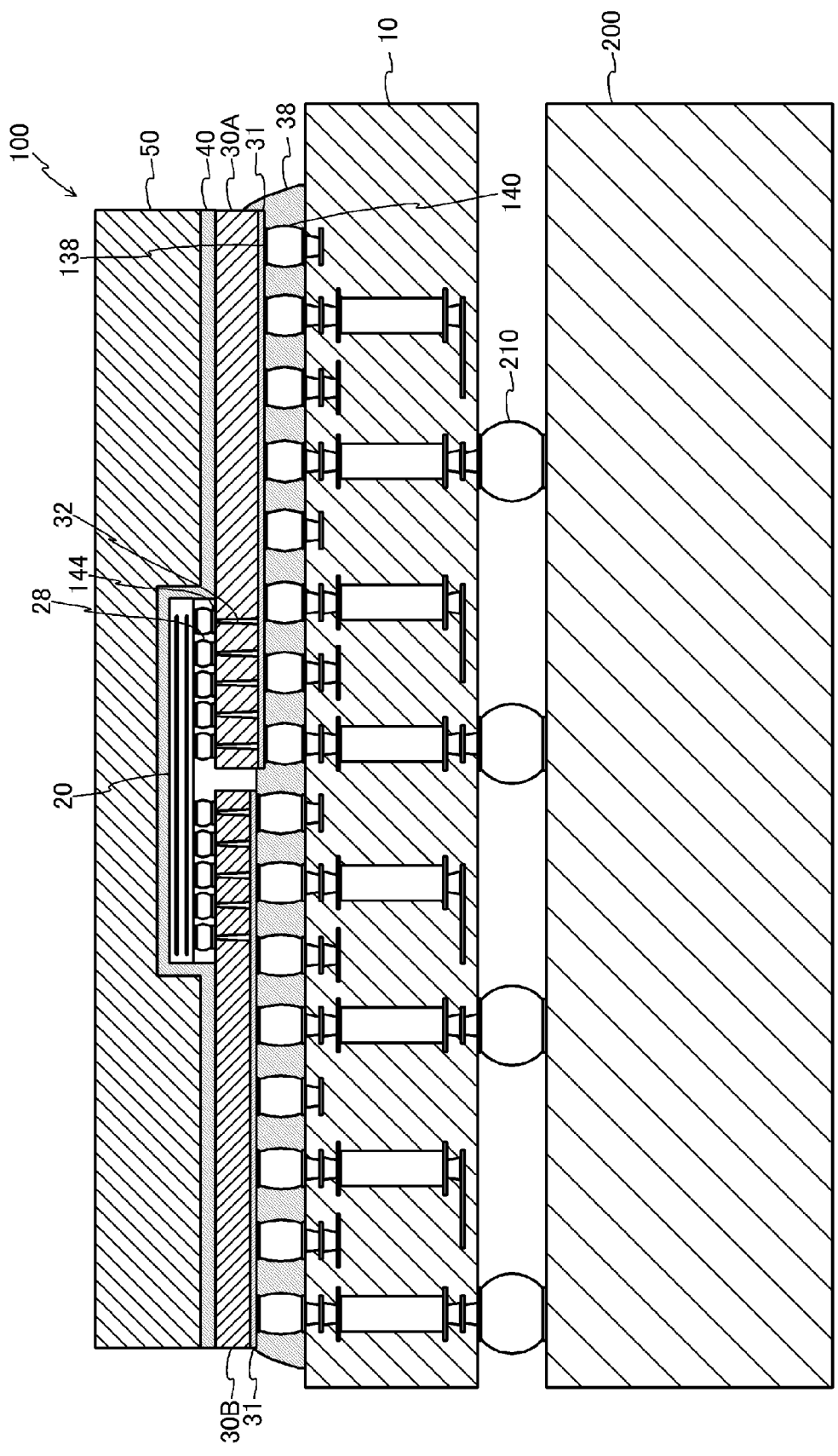
FIG. 1 is an cross sectional view of schematically illustrating a multi-chip module according to an embodiment.

The following description will be given of a multi-chip module and a method of manufacturing the multi-chip module according to an embodiment, with reference to FIGS. 1 to 6B. FIG. 1 is a cross sectional view of schematically illustrating a multi-chip module 100 according to an embodiment. The multi-chip module 100 is secured on a motherboard 200 through solder bumps 210, as illustrated in FIG. 1.

The multi-chip module 100 includes: a package board 10; four LSI chips 30A to 30D as chips; a silicon interposer 20 as a wiring board; and a heat spreader 50. The 30C and 30D are illustrated in FIG. 2.

The package board 10 is called as build-up board. The package board 10 is a multilayer board including: a board having wiring layers and called core board; and wiring layers formed on front and rear surfaces of the board. For example, the core board has four wiring layers, and the first to third wiring layers are provided on the front and rear surfaces of the board. The wiring formed in the package board 10 connects the motherboard 200 with the LSI chips 30A to 30D. Examples of the material of the board may be an epoxy resin, polyimide, or ceramic. An example of the material of the wiring is copper.

Each of the LSI chips 30A to 30D includes: a chip forming member composed of a silicon wafer; and a thin film 31 formed on the chip forming member, wiring patterns being formed in the thin film 31. Hereinafter, the thin films 31 of the LSI chips 30A to 30D are referred to as thin film circuits 31. The LSI chips 30A to 30D are secured on the package board 10 through the solder bumps 140. The vicinity of the solder bumps 140, that is, the clearance or pitch between the LSI chips 30A to 30D and the package board 10, is sealed with a resin (underfill material) 38.

Figure 2:
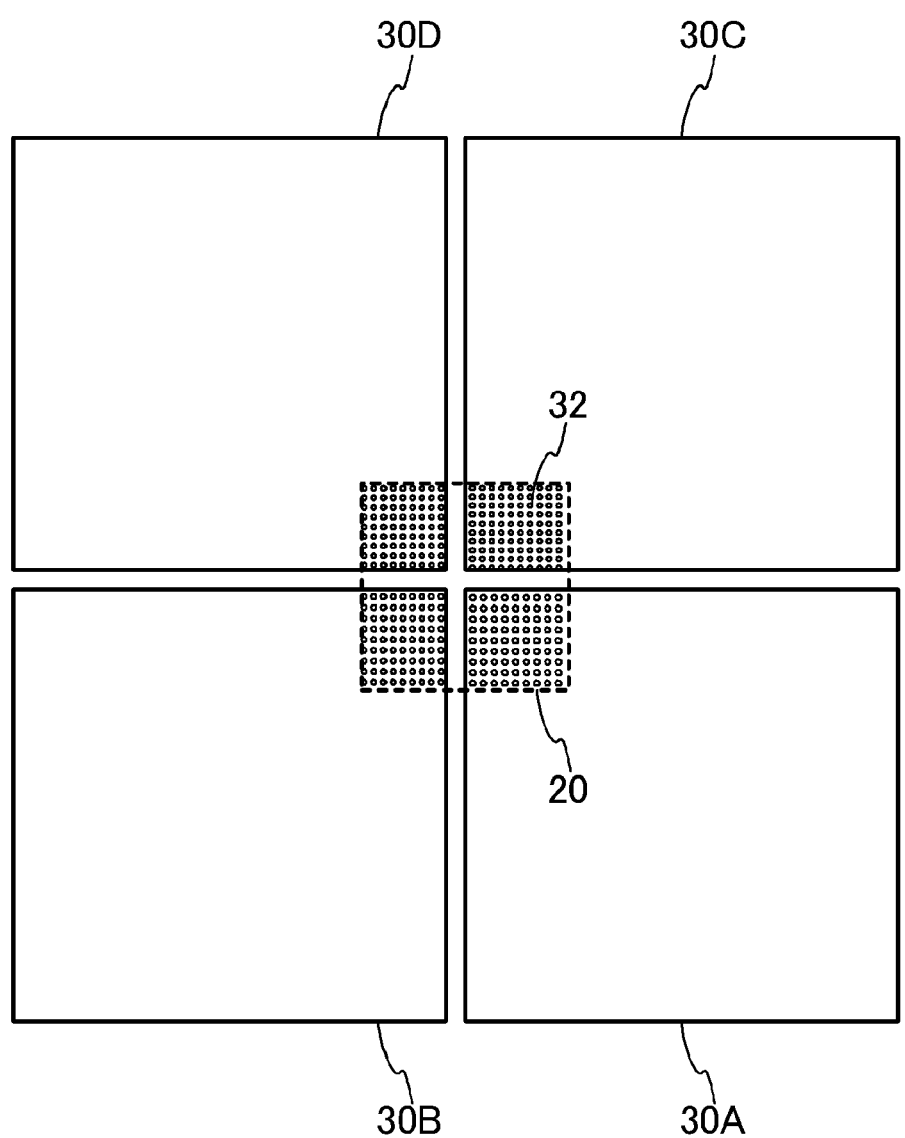
FIG. 2 is a plain view of an arrangement of LSI chips.

FIG. 2 schematically illustrates a positional relationship between the LSI chips 30A to 30D and the silicon interposer 20. As illustrated in FIG. 2, the LSI chips 30A to 30D are closely arranged to each other. Plural via holes 32 are provided at the corners, of the LSI chips 30A to 30D, close to each other, and penetrate through the LSI chips 30A to 30D, as illustrated in FIG. 1. For example, the via holes 32 are arranged at about 50 μm intervals. The via holes 32 are plated (filled) with a metal such as a copper. Pads 144 are respectively provided on upper ends of the via holes 32. Solder bumps 28 are respectively provided at upper sides of the pads 144.

Figure 3:
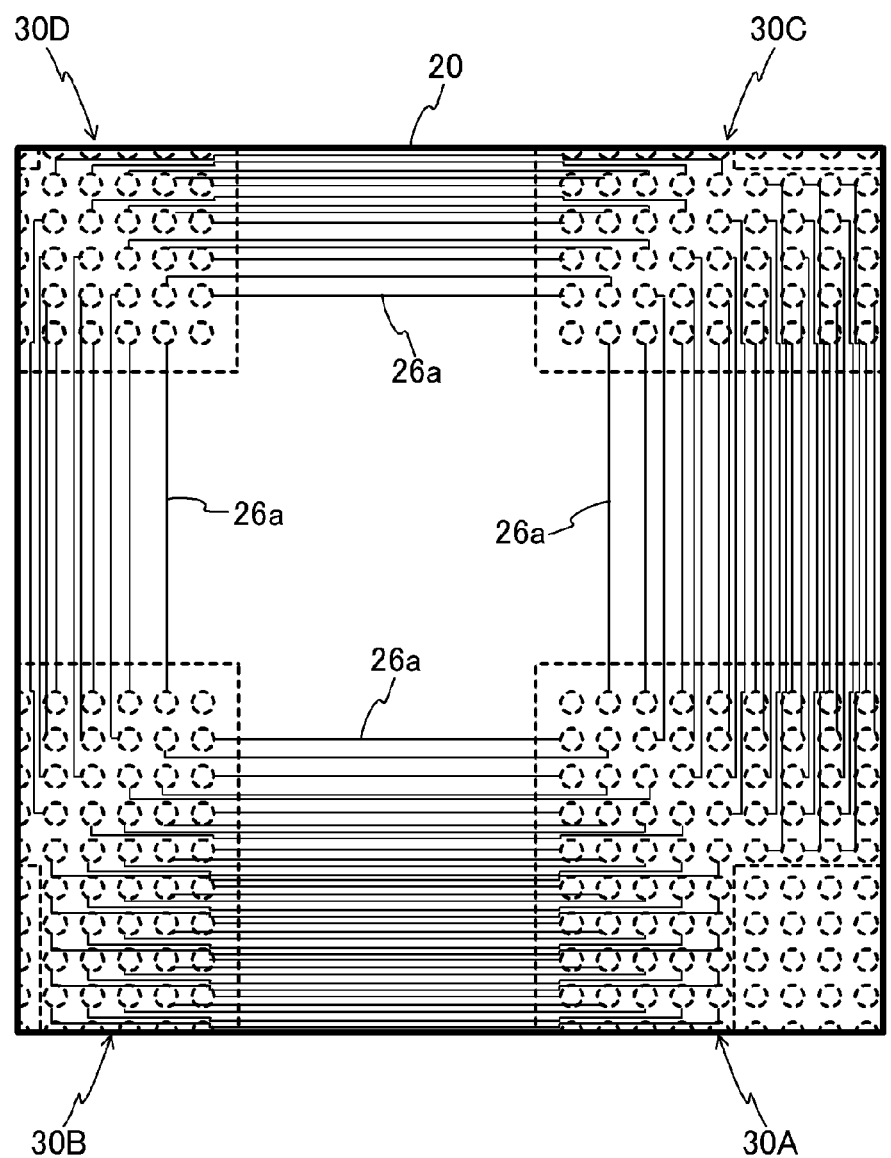
FIG. 3 is a partially enlarged view of a silicon interposer.

The silicon interposer 20 has a size so as to cover the area where the via holes 32 are provided in the LSI chips 30A to the 30D, as illustrated in FIGS. 1 and 2. For example, the size of the silicon interposer 20 is 10 mm by 10 mm. The silicon interposer 20 includes: a silicon board; and an insulting layer formed on the silicon board. A wiring pattern is formed in the insulting layer by a semiconductor manufacture equipment such as a semiconductor exposure apparatus. FIG. 3 is an enlarged view of the silicon interposer 20. The wiring pattern mentioned above is represented with a reference numeral 26a. The wiring patterns 26a connect the LSI chips 30A with the LSI chips 30B and 30D, and connect the 30C with the LSI chips 30B and 30D.

Returning to FIG. 1, the heat spreader 50 is provided to cover the upper surfaces of the LSI chips 30A to 30D and that of the silicon interposer 20 through a thermal injection material (TIM) 40. For example, the heat spreader 50 is made of a material such as copper, and has a function for radiating the heat generated in the LSI chips 30A to 30D.

In such a multi-chip module 100 configured above, the LSI chips 30A to 30D, which are electrically connected with the package board 10, are connected with each other through the wiring patterns 26a of the silicon interposer 20. Further, the thin film circuits 31 of the LSI chips 30A to 30D are electrically connected with the wiring patterns 26a of the silicon interposer 20 through the via holes 32. Thus, it is possible for the LSI chips 30A and 30D to be electrically connected with the package board 10 and electrically connected with each other through the silicon interposer 20.

Next, a method of manufacturing the multi-chip module 100 will be described with reference to FIGS. 4A to 6B.

Figure 4A:
FIGS. 4A to 4E are explanatory views of a method of manufacturing the multi-chip module.
Figure 4B:
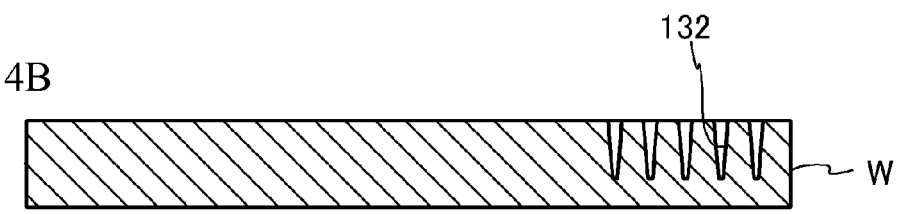
Figure 4C:
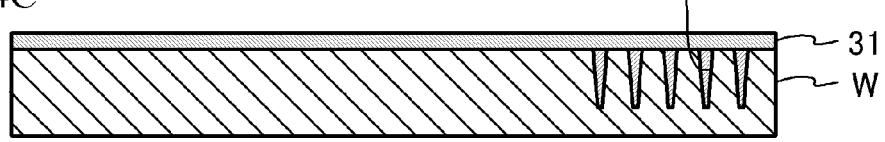
Figure 4D:
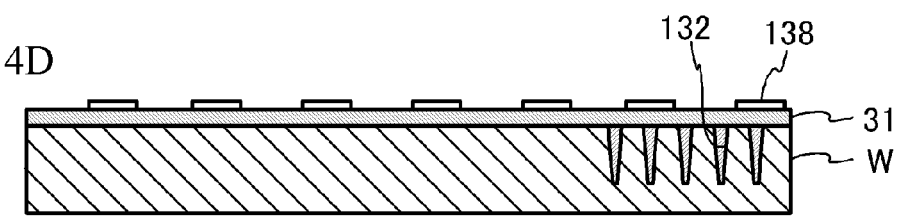
Figure 4E:
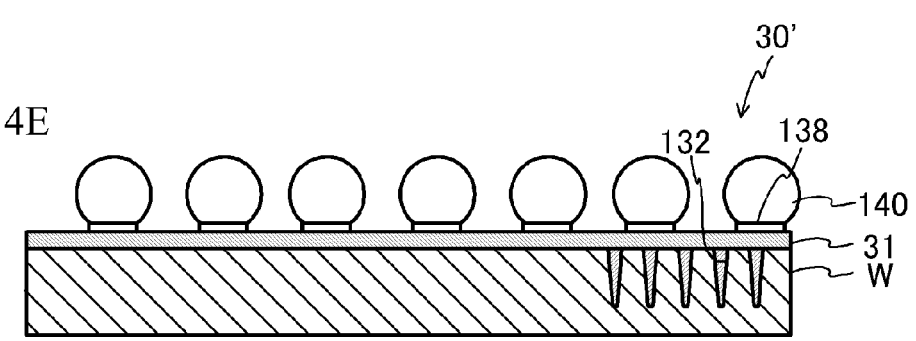

First, a chip forming member 30' for eventually becoming the LSI chips 30A to 30B is manufactured with reference to FIGS. 4A to 4E. In the production of the chip forming member 30', a silicon wafer W is prepared as illustrated in FIG. 4. The silicon wafer W has a predetermined thickness equal to or greater than each of the thicknesses of the LSI chips 30A to 30D. Next, holes 132 for eventually becoming the via holes 32 are formed by etching as illustrated in FIG. 4B. Then, as illustrated in FIG. 4C, the holes 132 of the silicon wafer W are plated and filled with a metal such as copper, so the thin film circuit 31 is formed. In the formation of the thin film circuit 31, a semiconductor manufacture equipment such as a semiconductor exposure apparatus is used. Then, pads 138 for signals are formed on the thin film circuit 31 by plating a metal such as a copper, as illustrated in FIG. 4D. The silicon wafer W has to be diced into a desired size, after or before the process illustrated in FIG. 4D is accomplished. The diced silicon wafer W becomes the chip forming member 30'. Then, the solder bumps 140 are respectively formed on the pads 138 of the chip forming member 30', as illustrated in FIG. 4E. Additionally, the silicon wafer W may be diced after the solder bumps 140 illustrated in FIG. 4E are formed.

Next, plural (four, in this case) chip forming members 30' are horizontally mounted on the package board 10 in the same arrangement with the LSI chips 30A to 30D illustrated in FIG. 2. For example, the clearance between the adjacent chip forming members 30' is 1 mm. In this mounting process, the chip forming member 30' is arranged on the package board 10 and is then pressured and heated, so that the chip forming member 30' is secured on the package board 10 through the solder bumps 140. Additionally, it is assumed the size of the solder bump 140 is different for every chip forming member 30', in FIG. 5A. After they are secured, the clearance between the package board 10 and the chip forming members 30' is filled with the resin (underfill material) 38.

Next, all of the chip forming members 30' are simultaneously polished to planarize the upper surfaces of the chip forming members 30'. In the planarization process, the chip forming members 30' are polished such that the holes 132 penetrate through the silicon wafer W. The holes 132 penetrating through the silicon wafer W become the via holes 32.

Figure 5A:
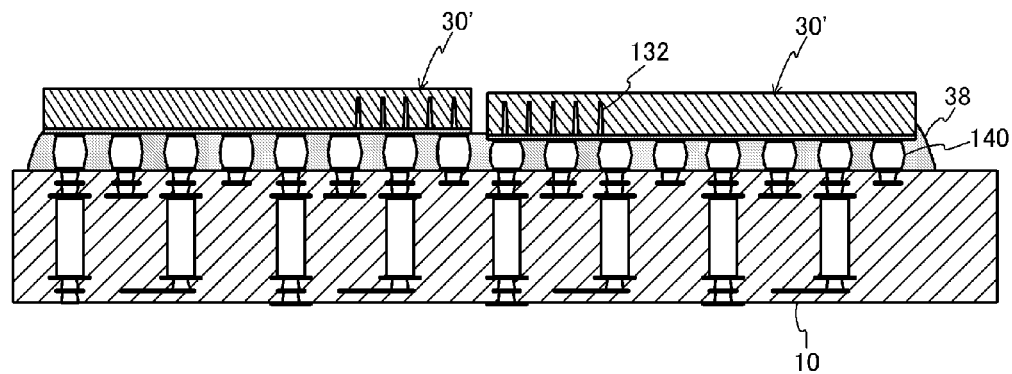
FIGS. 5A to 5C are explanatory views of the method of manufacturing the multi-chip module.
Figure 5B:
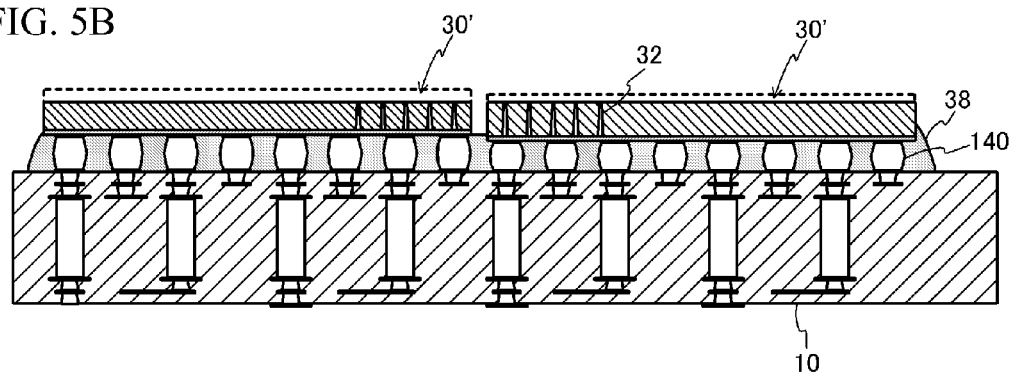
Figure 5C:
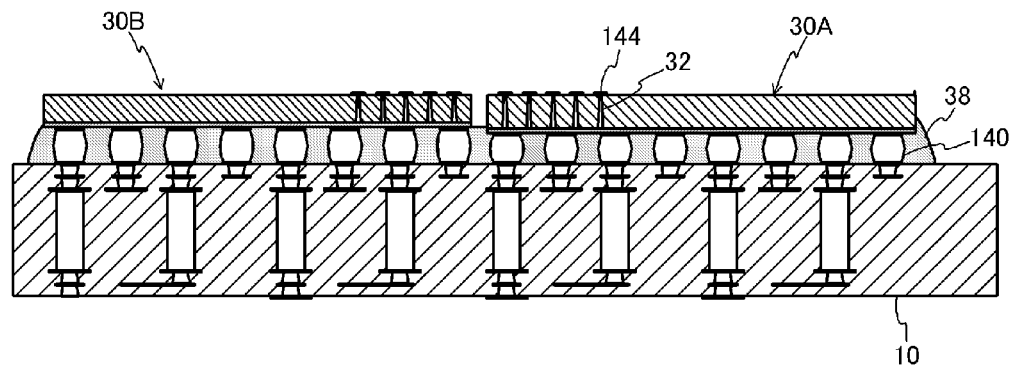

Then, plural pads 144 are formed on the upper surface of the 30'at the positions of the via holes 32, as illustrated in FIG. 5C. As mentioned above, in the stage where the pads 144 have been formed, the LSI chips 30A to 30D have been fabricated on the package board 10. Additionally, the pads 144 may not be formed on the chip forming member 30'. In this case, the LSI chips 30A to 30D have been fabricated in the state illustrated in FIG. 5B.

Figure 6A:
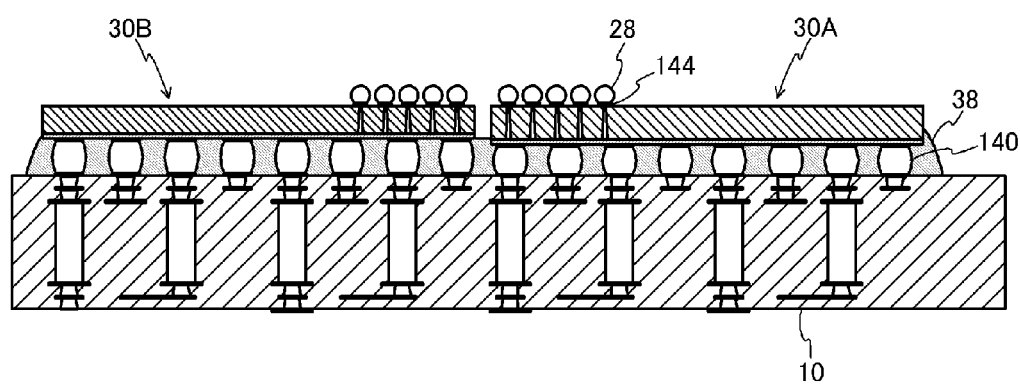
FIGS. 6A and 6B are explanatory views of the method of manufacturing the multi-chip module.
Figure 6B:
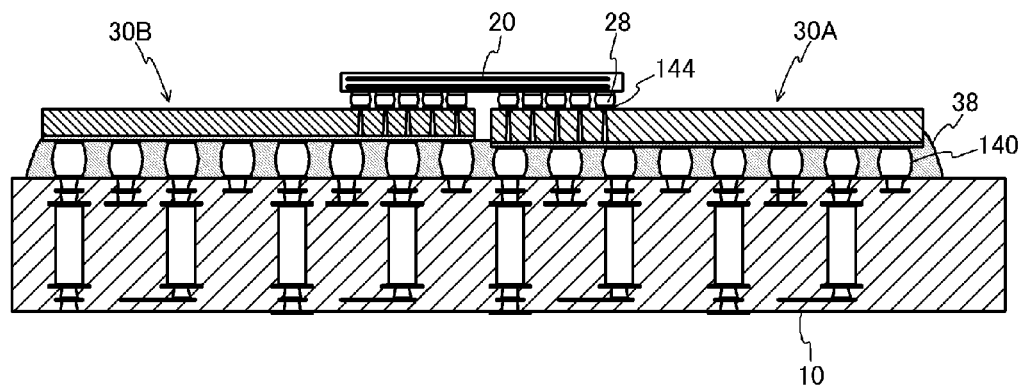

Then, the solder bumps 28 are respectively formed on the pads 144, as illustrated in FIG. 6A. Next, the silicon interposer 20 is arranged on the solder bumps 28, as illustrated in FIG. 6B. The silicon interposer 20 and the solder bumps 28 are jointed by pressurizing and heating them. After that, as illustrated in FIG. 1, the thermal injection material (TIM) 40 and the heat spreader 50 are arranged on the LSI chips 30A to 30D and the silicon interposer 20, so the production of the multi-chip module 100 is accomplished.

As mentioned above, in the present embodiment, the LSI chips 30A to 30D, which are electrically connected with the package board 10, are connected with each other through the wiring patterns 26a of the silicon interposer 20, which is arranged on the side opposite to the package board 10. The LSI chips 30A to 30D each have the thin film circuit 31 on the surface on the package board 10 side. The thin film circuit 31 and the wiring patterns 26a of the silicon interposer 20 are electrically connected with each other through the via holes 32 which penetrate through the LSI chip. With these arrangements, each of the LSI chips 30A to 30D ensures the electrical connection of the package board 10, and is electrically connected with the other LSI chip through the silicon interposer 20. Further, since the silicon interposer 20 can be manufactured separately from the package board 10, the wiring patterns 26a can be made into fine ones. Therefore, the length of the wiring patterns 26a can be made smaller, and the clearance between the LSI chips can be made smaller. Thus, in the present embodiment, the four LSI chips can be handled as single pseudo large-sized LSI chip.

Further, since it is unnecessary to provide the wiring area connecting the chips with each other on the ceramic or the build-up board, the clearance between the chips can be made smaller. Furthermore, the clearance between the chips can be smaller, so that the wiring length can be made smaller. This allows the high-speed transmission. Moreover, the shorter lengths of the wirings allows the use of an LSI driver that has the same specifications of those in the LSI. Accordingly, the LSI itself can be downsized and its power consumption can be decreased.

Additionally, in the present embodiment, a single pseudo large-sized LSI chip is achieved by the collection of the smaller chips. Thus, it is unnecessary to prepare a semiconductor manufacture equipment, such as a high-performance semiconductor exposure apparatus which is used for the production of the large-sized LSI chip or a large mask. Accordingly, a multi-chip module with desired capabilities can be manufactured at low costs.

Since the wiring patterns 26a are formed by the semiconductor manufacture equipment in the present embodiment, the clearance between the wiring patterns 26a can set smaller. Therefore, the clearance between the chips can be set smaller.

In the present embodiment, even when at least one of the LSI chips 30A to 30D is different in thickness from any of the others, the surfaces, on which the silicon interposer 20 is provided, of the LSI chips 30A to 30D can be leveled with each other. This ensures the electrical connection between the LSI chips with accuracy. Moreover, the LSI chips each having different thicknesses can be arranged on the identical package board 10.

In the present embodiment, the chip forming members 30' are horizontally disposed on the package board 10 such that the thin film circuit 31 faces the package board 10. The surfaces, opposite to the package board 10 side, of the chip forming members 30' are polished to be leveled with each other. Accordingly, the LSI chips are manufactured. Next, the silicon interposer 20 is mounted on the polished surfaces of the LSI chips, and the chips are connected with each other through the wiring patterns 26a of the silicon interposer 20. Thus, without the influence of the difference in thickness between the LSI chips, the LSI chips are electrically connected with each other through the silicon interposer 20 with accuracy.

In the present embodiment, the LSI chips 30A to 30D are four chips arranged in a matrix manner, and all of four chips are connected with each other through the wiring patterns 26a at the area where all of the four chips are adjacent to each other. Thus, the LSI chips are efficiently connected with each other.

Further, the package board 10 only has to include wirings connecting the motherboard 200 with the LSI chips 30A to 30D, so simple wiring specification is available and a low cost is achievable.

In addition, the above embodiment has described a case where the solder bump below the LSI chip 30A differs in heights from one below the LSI chip 30B and the LSI chip 30A differs in thickness from the LSI chip 30B. However, the embodiment is not limited to such a case. When the LSI chips 30A and 30B have the same thickness, the solder bumps may have the same height.

The above embodiment has described a case where the holes 132 do not penetrate though the silicon wafer W as illustrated in FIG. 4B. The embodiment is not limited to such a case. The holes 132 may penetrate through the silicon wafer W.

The above embodiment has been described a case where four LSI chips are provided. The embodiment is not limited to such a case. Arbitrary number of the LSI chips may be provided.

The above embodiment has described the LSI chip as a chip. The embodiment is not limited to the LSI chip. Another type of chip may be employed. The above embodiment has described the silicon interposer as a wiring board. The embodiment is not limited to the silicon interposer. Another board other then the silicon board may be employed. For example, a thin film board made of polyimide may be employed, on condition that the wirings are formed at about 50 μm pitches.

All examples and conditional language recited herein are intended for pedagogical purposes to aid the reader in understanding the invention and the concepts contributed by the inventor to furthering the art, and are to be constructed as being without limitation to such specifically recited examples and conditions, nor does the organization of such examples in the specification relate to a showing of the superiority and inferiority of the invention. Although the embodiment of the present inventions has been described in detail, it should be understood that the various changes, substitutions, and alterations could be made hereto without departing from the sprit and scope of the invention.

What is claimed is:

1. An electronic part comprising:
   a package board;
   a plurality of chips horizontally disposed on the package board, electrically connected with the package board, respectively provided with via holes penetrating through the plurality of chips, and respectively provided with circuits at surfaces facing the package board; and
   a wiring board disposed on an opposite side to the package board across the plurality of chips, and including a wiring pattern electrically connecting adjacent chips one another,
   wherein the circuit is electrically connected to the wiring pattern through the via holes.

2. The electronic part of claim 1, wherein the wiring pattern is formed by a semiconductor manufacture equipment.

3. The electronic part of claim 1, wherein at least one of the plurality of chips has a different thickness as compared to another chip of the plurality of chips.

4. The electronic part of claim 1, wherein the wiring board includes:
   a silicon substrate; and
   an insulating layer disposed on the silicon substrate, and the wiring Pattern is formed in the insulating layer.

5. A method of manufacturing an electronic part comprising:
   disposing a plurality of chips horizontally on a package board, each of the plurality of chips including a circuit facing the package board;
   polishing opposite surfaces of the plurality of chips with respect to the circuit to level the opposite surfaces of the plurality of chips;
   mounting a wiring board on polished surfaces of the plurality of chips; and
   electrically connecting the chips to one another with a wiring pattern provided in the wiring board.

* * * * *